(12) United States Patent
Hermiller et al.

(10) Patent No.: US 10,344,139 B1
(45) Date of Patent: Jul. 9, 2019

(54) ELECTRICALLY RESPONSIVE VARIABLE STIFFNESS POLYMERS

(71) Applicant: Cornerstone Research Group, Inc., Miamisburg, OH (US)

(72) Inventors: Jason Michael Hermiller, Lebanon, OH (US); Richard D. Hreha, Centerville, OH (US)

(73) Assignee: Cornerstone Research Group, Inc., Miamisburg, OH (US)

( * ) Notice: Subject to any disclaimer, the term of this patent is extended or adjusted under 35 U.S.C. 154(b) by 408 days.

(21) Appl. No.: 15/227,564

(22) Filed: Aug. 3, 2016

Related U.S. Application Data

(60) Provisional application No. 62/200,238, filed on Aug. 3, 2015.

(51) Int. Cl.
| | |
|---|---|
| *H01L 41/193* | (2006.01) |
| *C08K 3/16* | (2006.01) |
| *C08G 18/66* | (2006.01) |
| *C08G 18/73* | (2006.01) |
| *C08G 59/66* | (2006.01) |
| *C08G 59/22* | (2006.01) |
| *H01L 41/04* | (2006.01) |

(52) U.S. Cl.
CPC ............ *C08K 3/16* (2013.01); *C08G 18/6685* (2013.01); *C08G 18/73* (2013.01); *C08G 59/22* (2013.01); *C08G 59/66* (2013.01); *H01L 41/042* (2013.01); *H01L 41/193* (2013.01); *C08K 2201/001* (2013.01)

(58) Field of Classification Search
CPC ............................. H01L 41/193; H01L 41/18
USPC .......................................................... 310/800
See application file for complete search history.

(56) References Cited

U.S. PATENT DOCUMENTS

| | | | |
|---|---|---|---|
| 5,338,599 A | 8/1994 | Barrett | |
| 6,210,831 B1 * | 4/2001 | Gorkovenko | H01M 4/0485 |
| | | | 429/213 |
| 6,882,086 B2 | 4/2005 | Kornbluh et al. | |
| 8,237,324 B2 | 8/2012 | Pei et al. | |
| 9,231,186 B2 | 1/2016 | Busgen et al. | |
| 2007/0059901 A1 | 3/2007 | Majumdar et al. | |
| 2011/0021918 A1 * | 1/2011 | Morita | A61B 8/08 |
| | | | 600/443 |

(Continued)

OTHER PUBLICATIONS

Zhen-Qiang Dong, Yo Cao, Qi-Juan Yuan, Yi-Fu Wang, Jian-Hu Li, Bang-Ling Li, Sheng Zhang; Redox- and Glucose-Induced Shape-Memory Polymers; Macromolecular Rapid Communications 2013; Published online: DOI: 10.1002/marc.201300084.

(Continued)

*Primary Examiner* — Derek J Rosenau
(74) *Attorney, Agent, or Firm* — Dinsmore & Shohl LLP

(57) ABSTRACT

An electrically responsive polymer having a electrically responsive bulk polymer matrix, the electrically responsive polymer bulk polymer matrix comprising a base polymer matrix; an electrically responsive component, wherein the electrically responsive component comprises a disulfide, an oligosulfide moiety, or a plurality of thiol moieties; and an electrolyte salt; wherein the electrically responsive polymer is configured to transition from a first elastic modulus to a second elastic modulus when an external stimulus is applied to the electrically responsive polymer.

19 Claims, 9 Drawing Sheets

(56) References Cited

U.S. PATENT DOCUMENTS

2013/0146821 A1   6/2013  Meyer et al.
2016/0017870 A1   1/2016  Mather

OTHER PUBLICATIONS

Christopher L. Lewis, Elizabeth M. Dell; A review of shape memory polymers bearing reversible binding groups; Journal of Polymer Science Part B: Polymer Physics; vol. 54, Issue 14; Jul. 15, 2016; pp. 1340-1364.

* cited by examiner

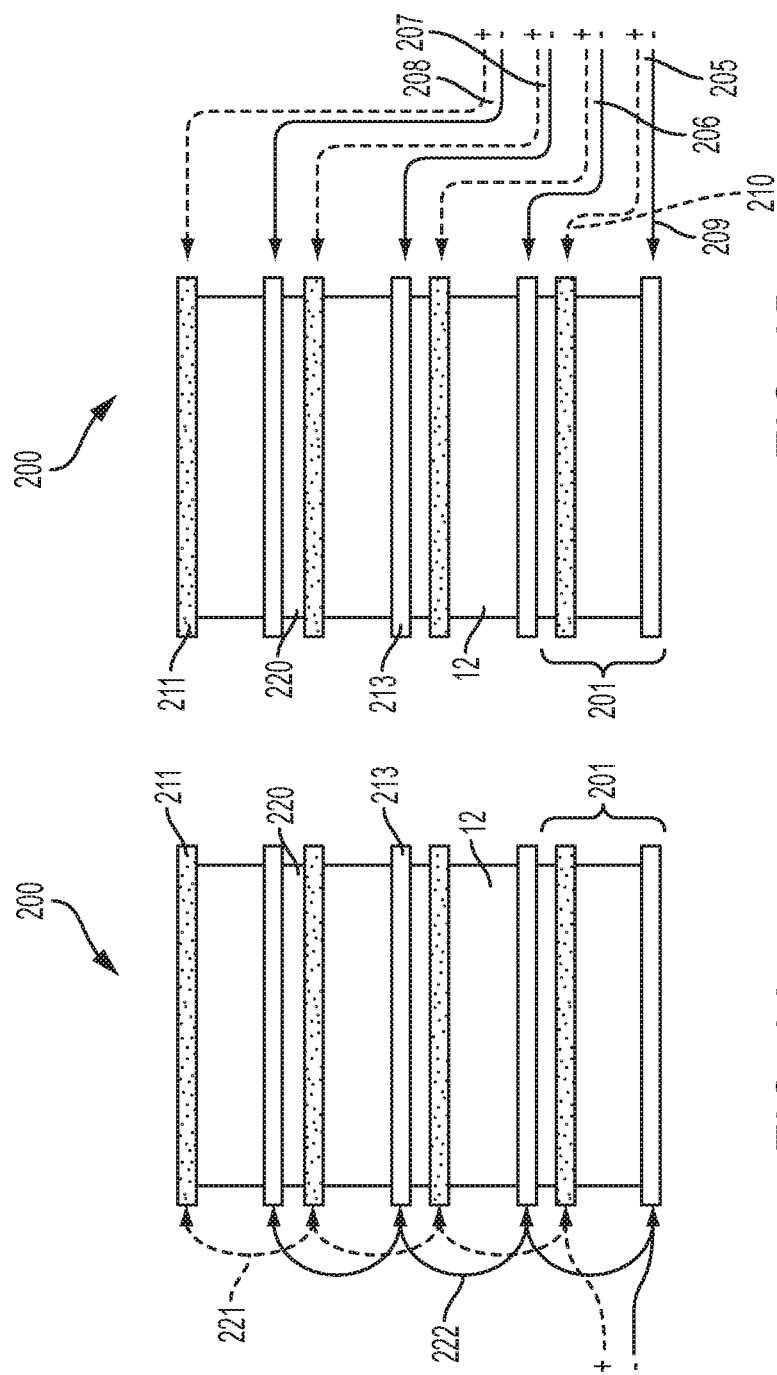

ELECTRICALLY RESPONSIVE VARIABLE STIFFNESS POLYMERS

CROSS-REFERENCE TO RELATED APPLICATIONS

This application claims priority to U.S. Provisional Patent Application Ser. No. 62/200,238 filed Aug. 3, 2015, which is incorporated by reference herein in its entirety.

STATEMENT REGARDING FEDERALLY SPONSORED RESEARCH OR DEVELOPMENT

The invention was made with U.S. Government support under Contract No. NNX12CD10P and NNX14CL89C awarded by NASA to Cornerstone Research Group Inc. The U.S. Government has certain rights in the invention.

TECHNICAL FIELD

Embodiments of the present disclosure generally relate to electrically responsive variable stiffness polymers, and specifically relate to electrically responsive variable stiffness polymers and their use in damping devices.

BACKGROUND

Aircrafts, automobiles, and various other load-bearing systems, devices, vehicles and the like, experience vibrations during operation that may degrade these structures and/or minimize their service life. Vibration damping devices, herein referred to as damping devices, are commonly used to combat these negative effects, by reducing the amplitude of resonant vibration and thereby dissipating the vibrational energy. Polymers and composites are often used as vibration-damping components in these damping devices.

Specifically, passively compliant polymers such as rubber, polyurethane elastomer have been utilized in damping devices. However, these materials typically have their damping properties tailored to a specific range of vibration frequency that cannot be changed once the material is made.

In a given polymer system, the molecular weight and crosslink density of the polymer may impact the thermal mechanical properties of a polymer. For example, an increase in the crosslink density of a polymer can frequently result in a substantial increase in the glass transition temperature of the polymer. Manipulation of the crosslink density of a polymer can evoke a change in the glass transition temperature ($T_g$) of the polymer. Through an oxidation process, the number of crosslinks in the material can be increased, therefore raising the $T_g$ of the material system. A second process, a reduction reaction, cleaves the crosslinks created in the first process, therefore lowering the $T_g$ of the material back to its original state.

Variable stiffness materials, such as piezoelectric ceramic or polymers, have also been utilized in damping devices. However, these variable stiffness materials require a constant supply of power in order to maintain the damping performance, which is less advantageous from an energy consumption standpoint especially when limited power is available.

SUMMARY

Accordingly, there is a continual need for damping devices that comprise polymers which are electrically tunable to various stiffness levels.

Embodiments of the present disclosure are directed to electrically responsive variable stiffness polymers that are controlled and tunable to various vibration frequencies to accommodate changing vibrational environments, and maintain variable stiffness without the need of constant power supply. By using electrically responsive polymers that have alterable physical properties in damping devices, the damping devices can be adjusted to the vibrational changes that a vehicle or device may encounter during operation. The electrically responsive polymers disclosed herein can maintain variable stiffness without constant power supply. These polymers are more energy efficient when compared to other electroactive polymers that require active supply of power to maintain variable stiffness, especially in systems or situations that have limited resources in terms of available power, such as in spacecraft systems.

One embodiment of this disclosure is directed to an electrically responsive polymer having an electrically responsive bulk polymer matrix. The electrically responsive bulk polymer matrix comprises a base polymer matrix, an electrically responsive component, and an electrolyte salt. The electrically responsive component comprises a disulfide, an oligosulfide moiety, or a plurality of thiol moieties. The electrically responsive polymer is configured to transition from a first elastic modulus to a second elastic modulus when an external stimulus is applied to the electrically responsive polymer.

Another embodiment of the present disclosure is directed to a damping device comprising at least two electrical contacts and at least one electrically responsive polymer disposed between the electrical contacts. The electrically responsive polymer comprising an electrically responsive bulk polymer matrix includes a base polymer matrix, an electrically responsive component comprising a disulfide, an oligosulfide moiety, or a plurality of thiol moieties, and an electrolyte salt. The electrically responsive polymer is configured to transition from a first elastic modulus and a second elastic modulus when an external stimulus is applied to the electrically responsive polymer.

BRIEF DESCRIPTION OF FIGURES

FIG. 2A is a side schematic depiction of a damping device having a plurality of electrically responsive polymer cells, the plurality of electrically responsive polymer cells being connected to a single power source.

FIG. 2B is a side schematic depiction of a damping device having a plurality of electrically responsive polymer cells, each electrically responsive polymer cell being connected to a separate power source.

DETAILED DESCRIPTION

Figure 1:
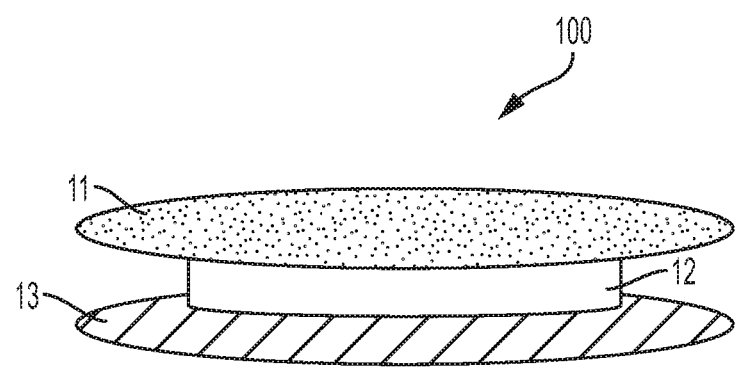
FIG. 1 is a schematic depiction of an electrically responsive polymer cell comprising electrically responsive polymer sandwiched between an anode and a cathode.

Specific embodiments of the present application will now be described. The disclosure may, however, be embodied in different forms and should not be construed as limited to the embodiments set forth in this disclosure. Rather, these embodiments are provided so that this disclosure will be thorough and complete, and will fully convey the scope of the subject matter to those skilled in the art.

Unless otherwise defined, all technical and scientific terms used herein have the same meaning as commonly understood by one of ordinary skill in the art. The terminology used in the description herein is for describing particular embodiments only and is not intended to be limiting. As used in the specification and appended claims, the singular forms "a," "an," and "the" are intended to include the plural forms as well, unless the context clearly indicates otherwise.

Embodiments of the present disclosure are directed to electrically responsive polymers stable at variable stiffnesses; the use of this material in a damping device; and methods of using the damping device.

According to one embodiment of this disclosure, the electrically responsive polymer may comprise or be in the form of an electrically responsive bulk polymer matrix. The electrically responsive bulk polymer matrix comprises a base polymer matrix, an electrically responsive component, and an electrolyte salt. The electrically responsive component comprises a disulfide or an oligosulfide moiety. The electrically responsive polymer is configured to transition from a first elastic modulus to a second elastic modulus when an external stimulus is applied to the electrically responsive polymer. In one embodiment, the external stimulus is an electrical voltage. Other stimuli such as thermal and light stimuli are contemplated as an alternative to the electrical voltage or as a supplemental stimulus which can be used in combination with the electrical voltage.

The term "bulk polymer" means a solid polymer composition. The solid polymer or a polymer that is essentially free of solvent, wherein "essentially free" means having less than 0.05 percent by weight solvent, or less than 0.01 percent by weight solvent. In one or more embodiments, the bulk polymer is a homogeneous, solvent free cured mixture that is made up of a base oligomer, monomers that copolymerize with the base oligomer, and electrically responsive component bonded to the base oligomer, and the electrolyte salt.

The term "matrix" in reference to the bulk polymer matrix means the conglomeration of the components listed above. The term matrix in reference to the base polymer matrix can be made up of various base oligomers monomers, polymeric units and other moieties—such as diisocyanate and diol moieties.

In order for the electrically responsive polymer to have more than one elastic modulus, the matrix must be able to conduct an electrical stimulus or voltage. The electrically responsive bulk polymer matrix is a conglomeration of at least three components—the base polymer matrix, the electrolyte salt, and the electrically responsive component—and the three components must be able to effectively transport electrical charge throughout the bulk polymer matrix. Therefore, the electrolyte salt is evenly dispersed through the electrically responsive bulk polymer matrix.

In one or more embodiments, the base polymer matrix may include elastomeric polymers or thermoset polymers. Various polymers are contemplated for the base oligomer with the prerequisite that the base oligomer is suitable for solvating the electrolyte salt and reacting with an electrically responsive component. As mentioned above, the base polymer matrix can be made up from base oligomers, monomers, polymeric units, and other moieties. The base oligomers for the base polymer matrix may be formed from many classes of organic polymer. A non-limiting list of base oligomers may include, but are not limited to: polyethylene glycol (PEG), PEG functionalized polystyrene, PEG functionalized acrylates, PEG functionalized urethanes, polyethylene oxide, polypropylene oxide, polyethylene oxide-co-polypropylene oxide, oligomeric epoxy, terminated polyethers, alcohol terminated polyethers or combinations thereof. A non-limiting list of polymeric units may include: epoxy, urethane, acrylate, olefinic, styrenic, polyester, polyamide, polyimide, polyethers, or combinations thereof. A non-limiting list of monomers may include hexamethylene diisocyanate, ethylene glycol, propylene glycol, piperazine, ethyl amine, propyl amine, or combinations thereof.

In one or more embodiments, the base polymer matrix has one or more polar moieties in the polymer backbone that facilitates solvating the electrolyte salt. These polar moieties may provide good compatibility with an electrolyte salt to form a polymer electrolyte for effective charge transport throughout the bulk polymer matrix. Examples of these moieties may include ethers, amines, carboxylic acids, esters, or combinations thereof.

In further embodiments, the base polymer matrix may have certain side chains attached to the polymer backbone, which allows for additional reactions with the electrically responsive component. These side chains may have functional groups such as amines, alcohols, and epoxies, which may provide a synthetically reactive group, allowing the addition of an electrically responsive component.

The electrically responsive components become part of the polymer network. The term "polymer network" is used instead of polymer chain herein because, as shown in Scheme 1, a trifunctional crosslinker connects the polymer chains as the monomers and other moieties react, resulting in a crosslinked network of polymers (as differentiating from a collection of linear polymer chains packed together). The monomers randomly react with their counterparts and the electrically responsive components are part of the monomer components, so the electrically responsive components are randomly dispersed throughout the base polymer matrix.

The electrically responsive component may encompass various compositions containing a disulfide, an oligosulfide moiety, a plurality of thiol moieties, or a composition capable of forming a disulfide or oligosulfide moieties, which can be readily integrated into the base polymer matrix. As used herein, "oligosulfide" means at least three sulfides. These electrically responsive components may include aliphatic disulfide or oligosulfide containing compounds, aromatic disulfide or oligosulfide containing compounds, or combinations thereof. Suitable electrically responsive components that react with the base oligomer to form the electrically responsive polymer matrix include, but are not limited to: 3-amino-5-mercapto-1,2,4-triazole, 5-amino-1,3,4-thiadiazole-2-thiol, 5,5'-disulfanediyldi(1,3,4-thiadiazol-2-amine), 5,5'-disulfanediylbis(1H-1,2,4-triazol-3-amine), bis(hydroxyethyl)disulfide, bis(2-hydroxyphenyl)disulfide, bis(3-hydroxyphenyl)disulfide, bis(4-hydroxyphenyl)disulfide, bis(2-aminophenyl)disulfide, bis(3-aminophenyl)disulfide, bis(4-aminophenyl)disulfide, or combinations thereof.

The amount of the electrically responsive component in the electrically responsive bulk polymer matrix may vary based on multiple factors. For instance, the electrically responsive bulk polymer matrix may select an amount that achieves a specific conductivity and/or a specific stoichiometric balance between the electrically responsive component and the base polymer matrix. In one embodiment, the electrically responsive bulk polymer matrix includes 1.0% to 40% by weight of electrically responsive component. In another embodiment, the electrically responsive component ranges from 2.0% by weight to 30% by weight; and in further embodiments, the electrically responsive component ranges from 5.0% by weight to 20% by weight.

Though a stoichiometric balance is maintained between the electrically responsive component and the base oligomer, some embodiments of the electrically responsive bulk polymer matrix may include larger weight percentage of the base oligomer. In one embodiment, the amount of the base oligomer in the electrically responsive bulk polymer matrix ranges from 40% by weight to 90% by weight. In another embodiment, the base oligomer ranges from 60% by weight to 90% by weight. While the weight percentages of base oligomer can vary, the amount of base polymer matrix and electrically responsive component can be stoichometrically balanced on a molar basis. As described in the Examples section, there is approximately 80% by weight of the base oligomer and approximately 9.0% of the electrically responsive component.

Disulfide bond formation is a versatile oxidation process. Disulfide formation is reversible and the stability of the disulfide bond has an important role in its biological utility. However, these reactions in biological systems depend heavily on the presence of solvent in the system. In the present disclosure, the disulfide formation was surprisingly discovered to be effective in a bulk polymer matrix without the use of solvents.

Disulfide formation is a formal two-electron oxidation:

$$2\ R\!-\!SH \rightleftharpoons R\!-\!S\!-\!S\!-\!R + 2e^- + 2H^+ \quad (1)$$

In order for there to be an effective charge transport, the polymer needs to allow good electrolyte salt dispersion within the electrically responsive bulk polymer matrix. The electrolyte salt may be any ionic compound that is dispersible in the bulk polymer matrix. In one embodiment, the electrolyte salt is an alkali salt. Alkali salts are readily dissolved in the bulk polymer matrix. In another embodiment, the alkali salt is a lithium salt. In further embodiments, the lithium salt may include, but is not limited to: lithium perchlorate, lithium hexafluorophosphate, lithium hexafluorotitanate, lithium trifluoromethane sulfonate, or combinations thereof.

In order to ensure that there is electrical charge transport, there needs to be sufficient amounts of electrolyte salt. In one embodiment, the amount of electrolyte salt in the electrically responsive bulk polymer matrix ranges from 1.0% by weight to 50% by weight; in other embodiments the amount of electrolyte salt ranges from 1.0% by weight to 25% by weight; and in further embodiments, the amount of electrolyte salt ranges from 5.0% by weight to 20% by weight.

The electrolyte salt, electrically responsive component, and base polymer matrix are combined and mixed together so that the electrolytes are evenly dispersed throughout the mixture, creating a homogeneous polymer matrix that is then cured. The curing process forms the electrically responsive bulk polymer matrix. Typically, aside from a small class of doped polymers that are thin films, many polymers are insulators, which are unable to transfer electrical charge. Therefore, electrochemical activation of polymer is often difficult. However, with the evenly dispersed electrolyte salt and electron rich polymer backbone, electrochemistry may occur within a bulk polymer matrix.

A structural representation of the electrically responsive polymer system is shown in Scheme 1.

Scheme 1

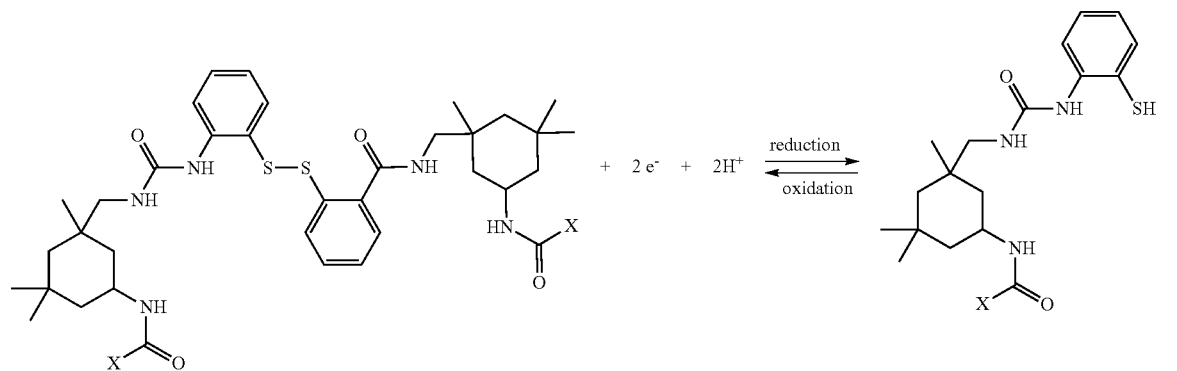

-continued

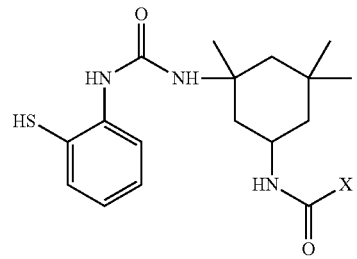

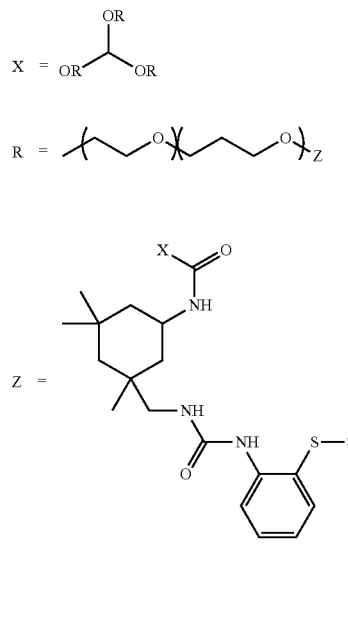

To form the electrically responsive bulk polymer matrix, the electrolyte salt is mixed into the reagent for forming the base polymer matrix for approximately 20 minutes or until the salt is dissolved. Then, the electrically responsive component is added to the mixture. The resulting composition is stirred to form a homogeneous mixture; this mixture is cured in a preheated oven. In some embodiments, the curing temperature ranges from 50° C. to 180° C. for approximately 12 hours. The curing temperature can be any range between 50° C. and 180° C. and any individual temperature. When utilized in damping applications as described below, the electrically responsive bulk polymer matrix is cured between the electrode substrates, and in other embodiments the electrically responsive bulk polymer matrix is molded separately and then mechanically sandwiched between the electrode substrates.

The physical properties of the electrically responsive polymer allow the polymer to have different crosslink densities based on the number of disulfide or oligosulfide bonds. The crosslink density changes when an external electrical voltage is applied. As demonstrated in Scheme 1, the electrically responsive component can form disulfide bonds when oxidized, and those disulfide bonds can break to form thiol groups when reduced. External stimuli affect the oxidation and reduction reactions. Whether sulfide bonds are reduced or oxidized depends on whether voltage applied is more positive or negative than the electrical potential of the electrically responsive moiety.

Figure 4:
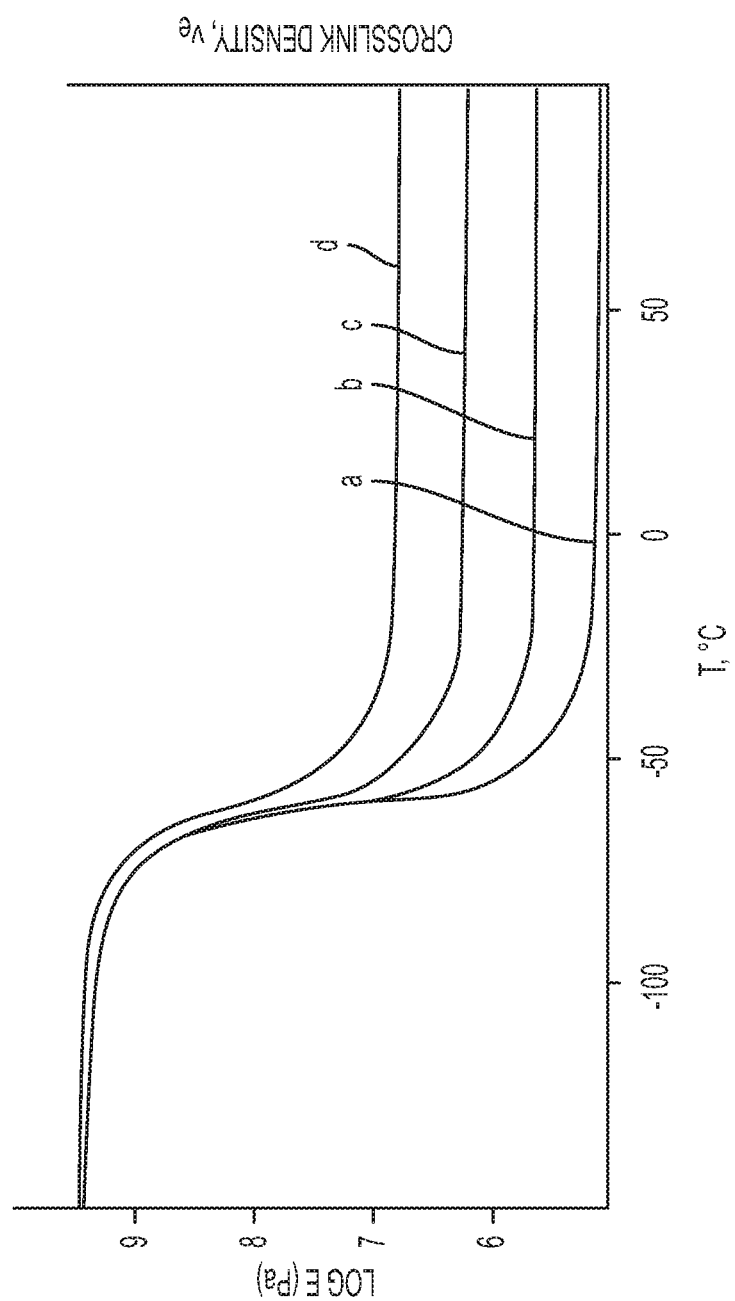
FIG. 4 is a prophetic graph showing the change in the storage modulus of an electrically responsive polymer as a function of temperature and crosslink density.

FIG. 4 depicts a theoretical graph of the storage modulus of a material as a function of temperature. At a temperature greater than the glass transition temperature ($T_g$), the storage modulus increases as the number of crosslink in the polymer (i.e. crosslinking density) increases. Since the electrically responsive polymer in this description can change its crosslink density when electrochemical redox reaction occurs at the electrically responsive moieties when a voltage is applied, the storage modulus is also changed during such application of electrical voltage. Said another way, application of a voltage in the electrically responsive polymer either becoming more or less crosslinked. The change in elastic modulus is stable even when the voltage is removed, and remains stable until a second different voltage is applied. In such cases that a reverse voltage is applied, the opposite change in crosslink density and elastic modulus is observed i.e., the change is reversible. In one or more embodiments, the elastic modulus of the electrically responsive bulk polymer matrix ranges from 0.61 MPa (megapascal) to 3.2 MPa at 25° C. and from 2.0 MPa to 16.5 MPa at 4° C.

Because of the ability of the electrically responsive polymer to adjust its stiffness (i.e., storage or elastic modulus) by forming and breaking crosslinking bonds, the electrically responsive polymer has many useful applications. It can be used in damping devices, where the storage or elastic modulus of the electrically responsive bulk polymer matrix may be tailored for the desired vibration damping behavior. The stiffness of the device is adjusted to a level sufficient for damping a first resonant vibrational frequency by applying a first electric voltage to increase or decrease the elastic modulus of the electrically responsive polymer. The elastic modulus increases or decreases from the initial first elastic modulus to a second elastic modulus in response to the first electrical voltage. The second elastic modulus corresponds to the stiffness sufficient for damping the first vibrational frequency. Then, when the first electric voltage is removed, the device maintains the elastic or storage modulus at substantially the second elastic modulus for a period of time. While maintained at this storage or elastic modulus, the damping device may dampen or attenuate the first vibrational frequency.

The electrically responsive polymer can adjust to multiple vibrational frequencies within a single damping device. Once the electrically responsive polymer adjusts to the first vibrational frequency, it can still be tailored or adjusted to a stiffness level sufficient for damping a second vibrational frequency by applying a second electric voltage to increase or decrease the elastic modulus of the electrically responsive polymer from the second elastic modulus to a third elastic modulus. The third elastic modulus corresponds to the stiffness sufficient for dampening the second vibrational frequency; and maintaining the device at substantially the third elastic modulus for a period of time, while removing the second electric voltage. In a similar manner, the elastic modulus of the device can be adjusted further to dampen a third, a fourth frequency, and so forth or any other specific targeted frequency as needed in various operational environment.

The term "period of time" that is described in these methods means greater than 5 minutes, and may be greater than one day. In some embodiments, the period of time is greater than a month, and in further embodiments the "period of time" extends indefinitely or until activated to a different modulus.

Since the vibrational frequencies within an aircraft changes during take-off, flight, and landing for example, this ability of the electrically responsive polymer to be tailored to various stiffnesses is beneficial to manage various vibration scenarios impacting the aircraft. Various additional applications are contemplated. For example, bridges and buildings have various forces exerted upon them. Having material that can change its elastic modulus due to the changes in environment surrounding the material can be very beneficial.

Figure 2C:
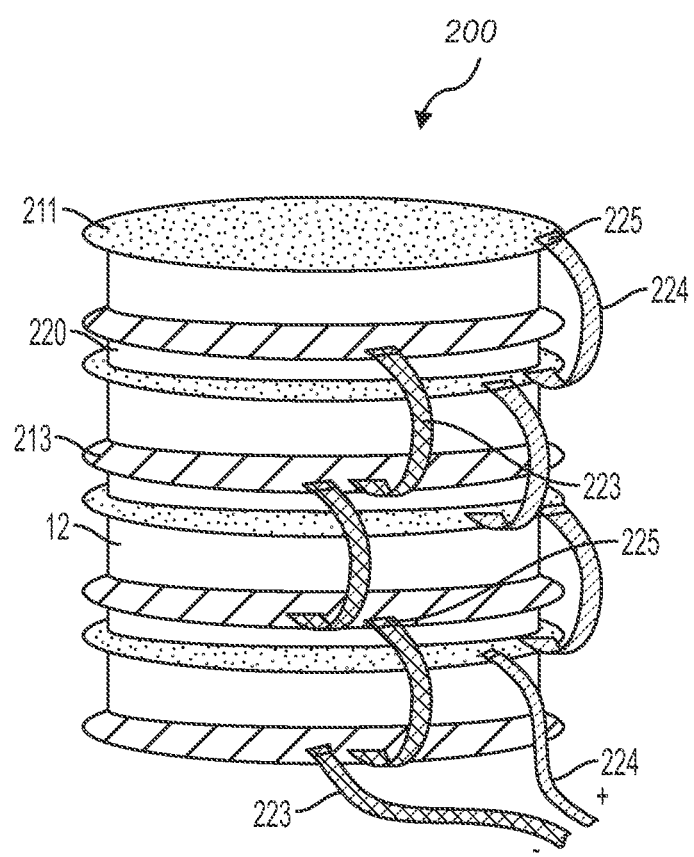
FIG. 2C is a perspective view of a damping device having an all-layer activation wiring system with flexible circuit traces, which are adhered to the electrodes with electrically conductive adhesives.
Figure 3A:
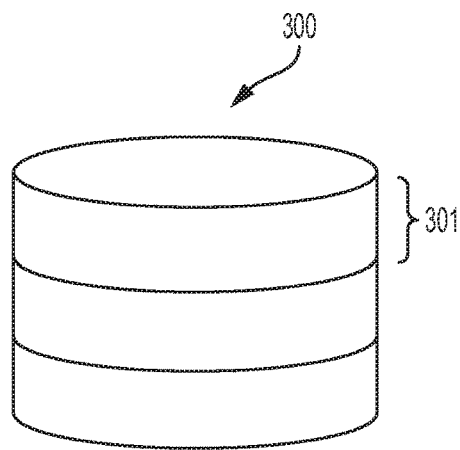
FIG. 3A is a schematic depiction of a periodic isolator, a damping device having three electrically responsive polymer cells.
Figure 3B:
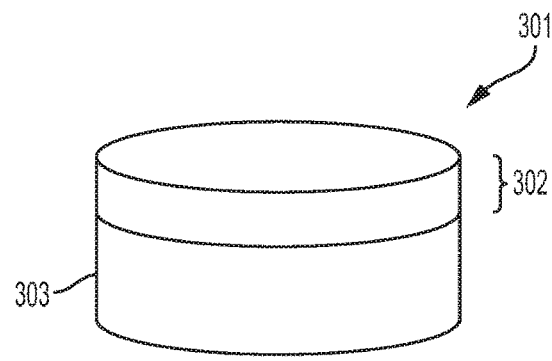
FIG. 3B is a schematic depiction of one of the three electrically responsive polymer cells in the periodic isolator damping device shown in FIG. 3A, which includes a steel layer and a compliant layer.
Figure 3C:
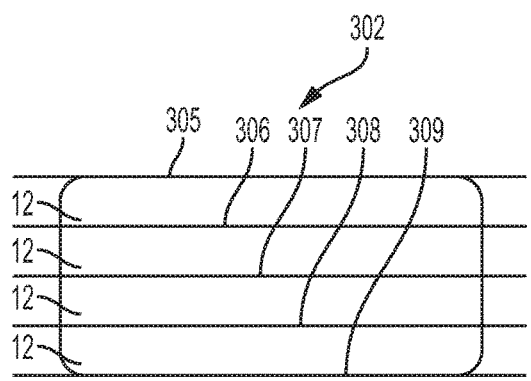
FIG. 3C is the compliant layer of one of the three electrically responsive polymer cells in a periodic isolator damping device, which comprises four layers of an electrically responsive polymer disposed between electrodes.

FIGS. 1, 2A, 2B and FIG. 3A show possible embodiments of the electrically responsive polymer as a component in a damping device 100 or 200, or a component in the layered periodic isolator 300 (see FIG. 3A-C). The electrically responsive polymer described herein is utilized in various apparatuses. In one embodiment as portrayed in FIG. 1, the electrically responsive polymer 12 is a component in a damping device 100. The damping device 100 contains at least two electrical contacts. In FIG. 1, the electrical contacts are electrodes: a cathode 11 and an anode 13. The damping device 100 includes at least one electrically responsive polymer 12, which is disposed between the electrical contacts. The electrically responsive polymer 12 includes the embodiments of the electrically responsive bulk polymer matrix described above. The electrically responsive polymer 12 and the electrical contacts may be configured to produce an electrical voltage difference across the polymer layer. In some embodiments, the thickness level of the electrically responsive polymer ranges from 0.010 to 0.24 inches. In other embodiments, the electrically responsive polymer thickness level ranges from 0.050 to 0.10 inches.

As used herein, "electrical contact" may comprise an electrical conduit which is in electrical communication with the electrically responsive polymer. While many of the embodiments utilize electrodes physically connected to the electrically responsive polymer, other embodiments are contemplated wherein the electrically responsive polymer is not bonded or physically connected to an electrical contact permanently, but the electrically responsive polymer is always in physical contact with electrodes when it is activated.

In the embodiment depicted in FIG. 1, the electrical contacts are electrodes, specifically a cathode 11 and an anode 13. The anode and cathode materials may be chosen from various common materials used in the electronics industry. Depending on the desired application, the electrodes may be rigid or flexible. Example electrode materials may include but are not limited to: indium tin oxide (ITO) coated glass, ITO coated plastics, ITO coated polycarbonate, gold coated fabric, silver coated fabric, platinum, stainless steel, and combinations thereof. The fabrics can be nylon, polyester, acrylic, cotton, glass, carbon fiber, graphite, scrim, random mat, veil, woven fabric, unidirectional fibers, nonwoven fabric, and any kind of textile fabrics. The use of the conductive fabric based anode and cathode materials allows composite structures to be fabricated. In some examples, the electrically responsive polymer 12 is infused and cured into the fabric, but this is not necessary. In other embodiments, when the fabric is not permeable, it can still be gold coated and the electrically responsive polymer 12 can still be cured with it.

In further embodiments as illustrated in FIGS. 2A-2C, the damping device 200 includes a plurality of electrically responsive polymer cells 201. In some embodiments, each electrically responsive polymer cell 201 is composed of at least one anode 213, at least one cathode 211, and at least one electrically responsive polymer 12 disposed between the cathode 213 and anode 211. Optionally, an insulating layer 220 may be disposed between two electrically responsive polymer cells 201. Multiple insulating layers 220 may be used depending on the number of electrically responsive polymer cells 201 that are in a damping device 200. In the embodiments depicted in FIGS. 2A-2C, there are four electrically responsive polymer cells 201, and there are three insulating layers 220, one disposed between each electrically responsive polymer cell 201. Various embodiments of the insulating layer 220 are contemplated. These may include, but is not limited to: non-electrically responsive polymers such as rubber, silicone, polyurethane, and Teflon™.

Various mechanisms for delivering power to the electrical contacts of the electrically responsive polymer cells 201 are contemplated herein. The embodiment in FIG. 2A depicts all electrically responsive polymer cells 201 being powered by one power source (not shown), which may be considered "all-layer activation". Various power sources are considered suitable, for example, a battery. With this embodiment depicted in FIG. 2A, there are essentially only two wires 221 and 222, which electrically connect the electrical contacts of the electrically responsive polymer cells 201 with the power source. Optionally, a system controller or processor (not shown) may be integrated within the power source or in communication with the power source. As shown in FIG. 2A, wire 221 is in contact with the cathodes 213 of each electrically responsive polymer cell 201, whereas wire 222 is in contact with the anodes 211 of each electrically responsive polymer cell 201.

Alternatively as shown in FIG. 2B, each electrically responsive polymer cell 201 may each have its own individual power source. Without being bound by theory, this arrangement allows control over the individual electrically responsive polymer cells 201, which is beneficial if different storage modulus characteristics are desired for individual electrically responsive polymer cells 201. Though the embodiment in FIG. 2B includes a set of wires 205, 206, 207, and 208 for each layer. The damping device 200 in FIG. 2B includes four sets of wires 205, 206, 207, and 208; each set has a positive wire 210 connected to the cathode 213 and a negative wire 209 connected to the anode 211. Each set of wires is routed back to the individual power source. While not shown, the damping device 200 may optionally include a system controller which modulates separate voltage signals to each electrically responsive polymer cell 201 to obtain independent activation of the respective electrically responsive polymer cell 201 of the damping device 200. In some embodiments, the system controller (not shown) has a DC power supply equipped with a microprocessor to allow sensing of and responding to the mechanical behavior of the damping device. In another embodiment, the system controller is a Gamry 600 Potentiostat or BK Precision DC power supply.

Various electrical connectors or wiring embodiments are considered suitable. Referring to FIG. 2C, the wiring may be flexible circuit traces 223 and 224 that are bonded with electrically conductive adhesive 225 to the cathode 211 and anode 213 of the electrically responsive polymer cell 201. These flexible wires 223 and 224 are connected to their respective cathodes 211 and anodes 213 within each electrically responsive polymer cell 201 to provide the activation voltage from a power source and optionally a system controller. In other embodiments, different stacking arrangements or different connection point decisions can be made from a polarity perspective based on the application and associated variables such as minimization of circuit mechanical stress and reduction of the overall number of connections.

In other embodiments, the electrically responsive polymer 12 is a component in a periodic isolator 300 (see FIGS. 3A-3C), also a damping device. Additional details regarding the operation of the periodic isolator are provided in the Examples which follow. In one embodiment, the periodic isolator contains three isolator cells 301. Each isolator cell has a compliant layer 302 and a steel layer 303. The compliant layer 302 may comprise at least one and often include a plurality of layers of electrically responsive polymer 12. The compliant layer 302 embodiment of FIG. 3C comprises four layers of the electrically responsive polymer 12 described in this disclosure. Electrodes 305, 306, 307, 308, and 309 are disposed between the layers of electrically responsive polymer 12 and on the top and bottom of the compliant layer 302. While wires connecting the electrodes are shown in FIG. 2A-2C, the positive and negative voltage is applied to the device in FIG. 3A-3C in a similar fashion to that in FIGS. 2A-2C. The wires may be connected to the electrodes by a conducting metal clip (not shown) or the conductive adhesive 225. Many types of bonding adhesives are commercially available, for example, EG 8050, an electrically conductive, silver filled epoxy from AI Technology Inc.

Referring again to FIGS. 1-2C, the damping devices 100 and 200 are operated by applying a first external stimulus to the device. After waiting a predetermined amount of time, from 1 minute to 4 hours, the storage modulus of the electrically responsive polymer changes to the observed value. A second external stimulus is applied to the device, which causes further changes in the elastic modulus of the electrically responsive bulk polymer matrix. The second external stimulus is either more positive or more negative than the first external stimulus. Depending on the charge of the electrical voltage, the elastic modulus will either increase or decrease. The ability to tailor the elastic modulus allows any damping device containing the electrically responsive polymer described in this disclosure to change elastic modulus for various vibrational environments.

As would be understood by the person skilled in the art, the degree of elastic modulus change will depend on the voltage administered and the material of the electrically responsive polymer. Moreover, the voltage administered may also vary. In one or more embodiments, the voltage administered is +/−7 V or less, or +/−6 V or less, or +/−5 V or less, or +/−4 V or less, or +/−3 V or less.

Examples

The following examples illustrate one or more of the embodiments described in the disclosure.

Representative Epoxy System

Lithium perchlorate (1.0 g, 10% by weight) was dissolved in poly(ethylene glycol) diglycidyl ether ($M_n$ 500, 7.3 g, 73% by weight). To this mixture, 3-amino-5-mercapto-1,2,4-triazole (11-17% by weight, 1.7 g, 17%) was added. The mixture was then hand-mixed to form a homogeneous mixture. The resulting mixture was cured at 150° C. in a preheated oven for 12 hours. The material can either be cured between the electrode substrates or molded separately and then mechanically sandwiched between the electrode substrates. The above formulation resulted in a material in its lowest crosslinked state.

Representative Urethane System

Lithium perchlorate (1.0 g, 10% by weight) was dissolved in glycerol ethoxylate-co-propoxylate triol $M_n$ ~2600 (8.06 g, 80.6% by weight). To this mixture, 3-amino-5-mercapto-1,2,4-triazole (0.55 g, 5.5%) was added and sonicated for 20 minutes to facilitate dissolution. Then, the hexamethylene diisocyanate (0.39 g, 3.9%) and a catalytic amount of dibutyl tin dilaurate were added and mixed by hand. The material was cured at 100° C. for 12 hours. The material can either be cured between the electrode substrates or molded separately and then mechanically sandwiched between the electrode substrates. The above formulation resulted in a material in its lowest crosslinked state.

Periodically Layered Gearbox Isolators

Periodically layered isolator technology operate by exhibiting transmissibility "stop bands", or frequency ranges in which there is very low transmissibility resulting from wave reflection mechanics. This produces a compact and effective mechanical notch filter between 500 Hz and 3000 Hz. In FIG. 3A, a simple schematic of a periodic isolator is depicted. Typical experimental isolator transmissibilities have an increasing number of cells that can range from one to twenty, but in FIG. 3A there are only three isolator cells.

Each of the isolator cells in the periodic isolator has a damping component similar to those found in FIGS. 2A-2C. In FIGS. 2A-2C, the damping device was fabricated by co-curing electrode material—such as indium tin oxide (ITO), gold, and carbon—to both sides of the electrically responsive polymer, either an epoxy-based or polyurethane-based, which formed an electrically responsive polymer cell. Multiple electrically responsive polymer cells were then stacked and bonded using insulating layers. In this example, the insulating layer was silicone rubber. The plurality of electrically responsive polymer cell may form the compliant layer in the isolator cell. Both the number of isolator cells in the periodic isolator and the number of electrically responsive polymer cells in the compliant layer are based on the required damping device performance. The individual cell thickness may be limited by the effectiveness of activations across the thickness of the cell.

Transmissibility tests of a layered damping device with electrically responsive polymers compliant cells were fabricated and tested. The layered damping device consisted of three cells, where one cell is comprised of an ¼ inch thick compliant layer and an ¾ inch thick steel layer (FIG. 3A-3C). The steel layers were 2 inches in diameter and the compliant layers were oversized due to electrode geometry requirements. The electrodes were two inches in diameter as well. The ¼ inch compliant layers were each comprised of four 1/16 inch thick electrically responsive polymer layers that were electroded and stacked so that like electrodes were located on contacting faces. The layers were bonded together with a thin, flexible adhesive. The goal of the test was to demonstrate a change in dynamic behavior of the layered isolator by controlling the voltage across the electrically responsive polymer layers, and thus the storage modulus magnitude of the electrically responsive polymer layers.

Experimental Setup:

The experimental setup for the transmissibility experiment was a digital signal analyzer that generated excitation signals and measured isolator transmissibility. A standard power supply generated the activation voltages of positive (+) 6.5 V and negative (−) 6.5 V. The excitation signal consisted of white noise over various frequency ranges. Two accelerometers, one on top of the isolator and one on the excitation base, directly measured the transmissibility through the isolator using the digital signal analyzer to process the time signals and convert them into a frequency response result.

Compressive Storage Modulus Studies

Figure 5A:
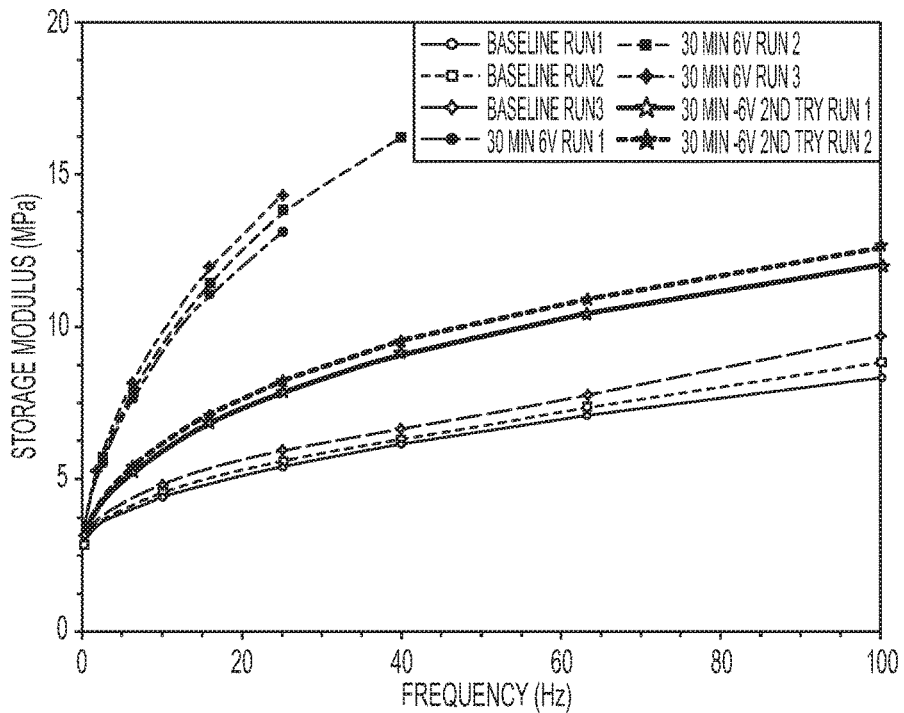
FIG. 5A is graphical illustration of the storage modulus as a function of frequency for electrically responsive polymers activated at a temperature of 4° C. (Celsius) over a period of thirty minutes.
Figure 5B:
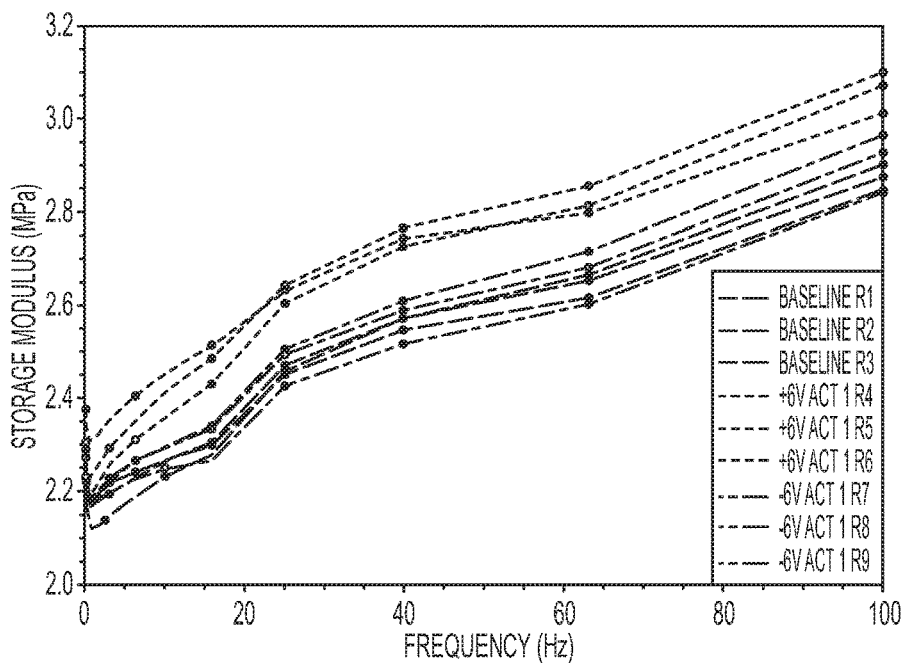
FIG. 5B is a graphical illustration of the storage modulus as a function of frequency for electrically responsive polymers activated at a temperature of 25° C. over a period of thirty minutes.

The data in FIGS. 5A and 5B were compiled from samples of the representative epoxy system were sandwiched between ITO coated glass. The graphs in FIGS. 5A and 5B showed the change in compressive storage modulus at varying frequencies as a function of activation, activation time, and temperature (4° C. in FIG. 5A; 25° C. in FIG. 5B). The sample was exposed to either +6 V or −6 V relative to the working electrode for 30 minutes. The compressive storage modulus was measured 3 times at each condition to determine the variation in the measurement. After the +6 V activation, an increase in the compressive storage modulus was observed. Upon exposure to the −6 V activation, the storage modulus returned to its initial value.

A Dynamic Mechanical Analyzer (DMA) was used, and the tests were conducted with the compression fixture. The DMA compression mode, a standard test, induced a defined oscillating displacement on the sample and measured the force required for the displacement in order to calculate the modulus. The voltage for activation/deactivation was recorded separately by Gamry 600 Potentiostat while the modulus was recorded by the DMA. The experiments were performed with a DMA used a TA Instruments, DMA Q800. The oscillation rate was 10 Hz at 25° C.; and an alternating current of positive and negative (±) 3 V.

Figure 6:
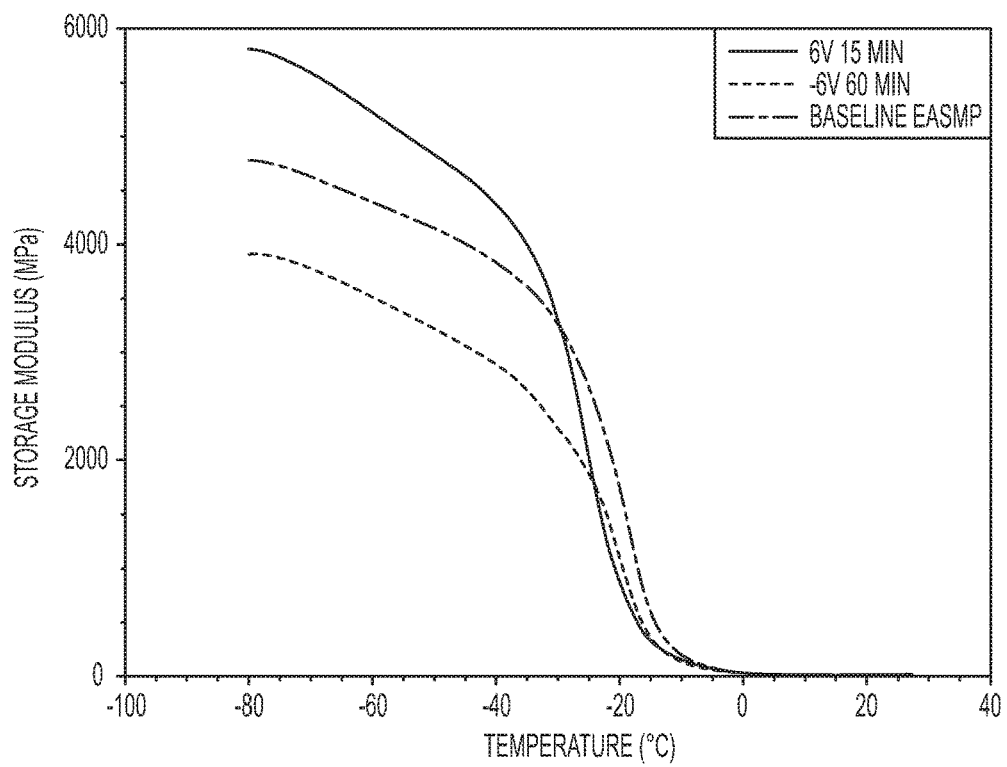
FIG. 6 is graphical illustration of the change in storage modulus as a function of temperature for electrically responsive polymers that shows the dynamic mechanical analysis data obtained during crosslinking and uncrosslinking.

Referring to FIG. 6, DMA test specimens were prepared and its storage modulus versus temperature curves were obtained on a TA instruments DMA. The sample was sandwiched between ITO coated glass and exposed to a +6 V potential and a −6 V for a period of time. The storage modulus versus temperature curve was obtained after each exposure (FIG. 6).

Figure 7:
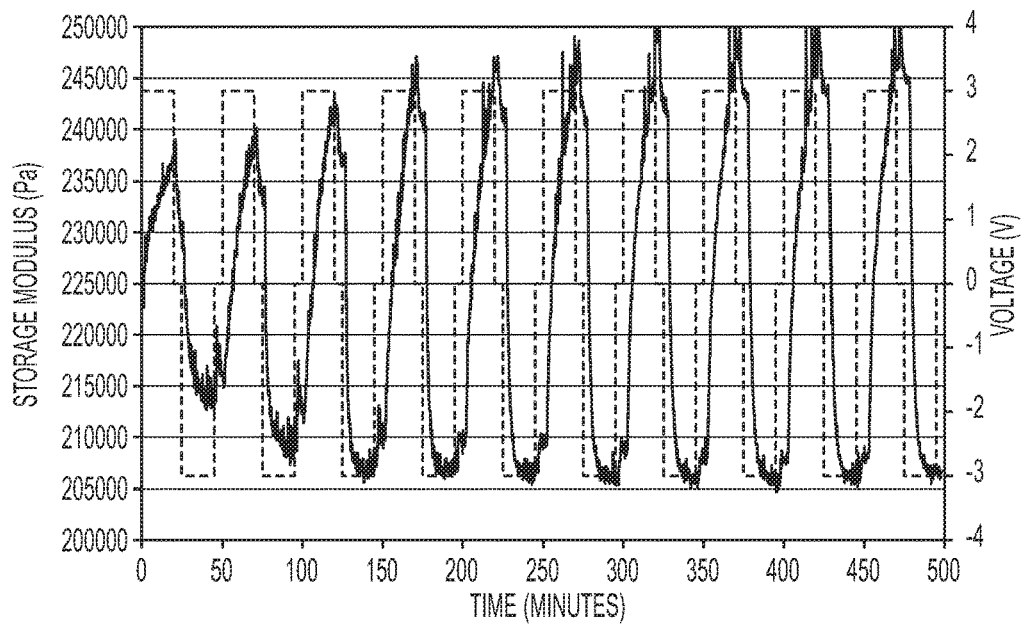
FIG. 7 is a graphical illustration of the change in storage modulus over time for electrically responsive polymer during ±3 V switching cycles for a total 10 cycles with 5 minute dwells at 0 V.

In FIG. 7, the storage modulus of an electrically responsive polymer having bis(2-aminophenyl)disulfide polyurethane as the electrochemical component was measured as a function of time. The graphical depiction of the near symmetrical storage modulus changed in response to the voltage cycles for +/−3 V activation cycles. The data showed that the material exhibited nearly 20% change in shear storage modulus at a constant oscillation rate of 10 Hz and temperature at 25° C.

Flexural Storage Modulus

Figure 8:
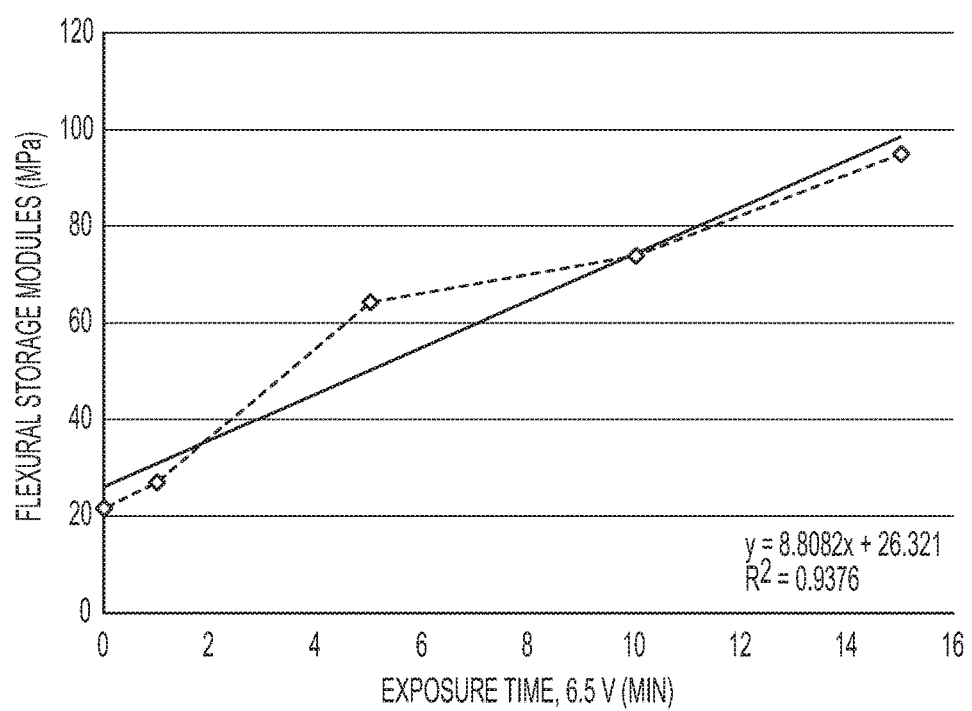
FIG. 8 is a graphical depiction of a flexural storage modulus as a function of exposure of time to electrical voltage at +/−6.5 V.

To evaluate the controllability of the electromechanical response, a study of the change in the flexural storage modulus as a function of time exposure to an electrical stimulus was performed. In this study, the flexural storage modulus measurements were taken on the DMA after the material have been exposed to +6.5 V for 0, 1, 5, 10, and 15 cumulative minutes. The electrically responsive polymer, comprising an epoxy-based polymer, demonstrated a continual stiffness increase with exposure time to +6.5 V at 20° C. which demonstrate the controllable response of the polymer by electrical activation at room-temperature (Table 1 and FIG. 8). In this system single cell system, the electrodes were ITO and there was not an insulator.

TABLE 1

| Exposure Time, 6.5 V (min) | Flexural Storage Modulus (Mpa) |
|---|---|
| 0 | 21.43 |
| 1 | 26.84 |
| 5 | 64.04 |
| 10 | 73.73 |
| 15 | 94.62 |

Shear Storage Modulus Studies

Figure 9:
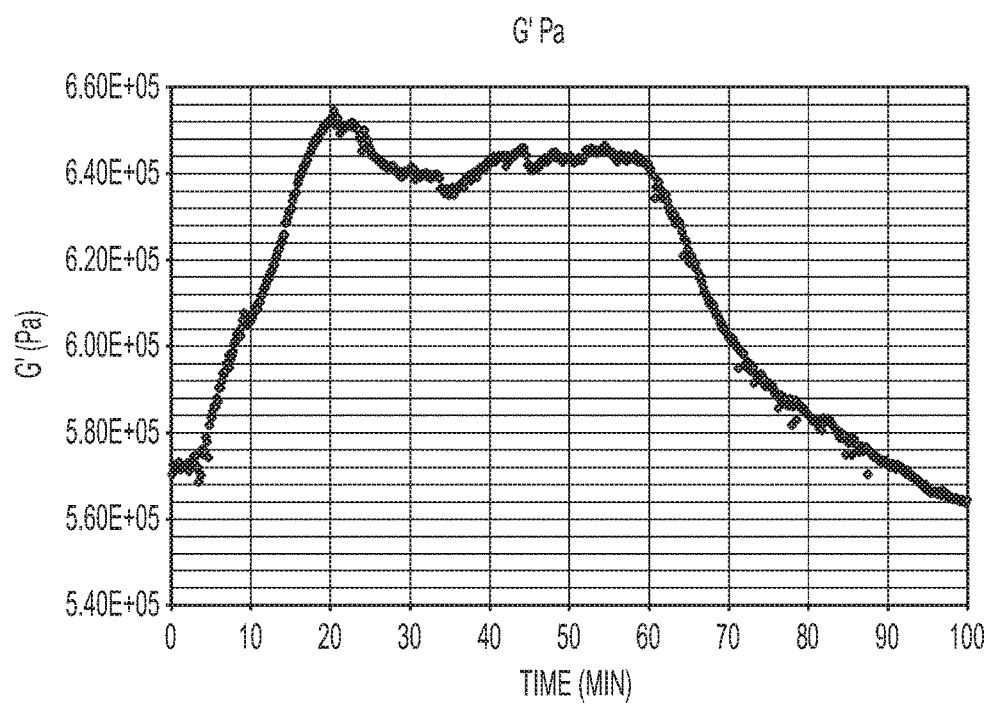
FIG. 9 is a graphical depiction of a shear storage modulus of an electrically responsive polymer as a function of time when there is applied positive voltage for 20 minutes, then no applied electrical field for 40 minutes, and then negative voltage for 40 minutes.

The change in shear modulus was measured in real time using TA Instruments AR2000 rheometer and the Gamry Reference600 Potentiostat (FIG. 9). By combining cyclic voltammetry, and the rheology mechanical testing, the mechanical response of the sample in relation to its electrical properties was observed. The electrically responsive polymer included a polyurethane-based polymer with a gold coated fabric. The electrically responsive component in the example was 3-amino-5-mercapto-1,2,4-triazole. For 20 minutes a positive electrical voltage was applied to the electrically responsive polymer to increase the storage modulus; followed by 40 minutes of no external voltage was applied to the electrically responsive polymer to show that the storage modulus can be stably held; and, finally, a negative electrical voltage was applied to the electrically responsive polymer for 40 minutes to reverse the modulus to a lower value.

It should be apparent to those skilled in the art that various modifications can be made to the described embodiments without departing from the spirit and scope of the claimed subject matter. Thus, it is intended that the specification cover modifications and variations of the described embodiments provided such modification and variations come within the scope of the appended claims and their equivalences.

The invention claimed is:

1. An electrically responsive polymer having an electrically responsive bulk polymer matrix, the electrically responsive polymer bulk polymer matrix comprising:
   a base polymer matrix;
   an electrically responsive component, wherein the electrically responsive component comprises a disulfide, an oligosulfide moiety, or a plurality of thiol moieties; and
   an electrolyte salt;

wherein the electrically responsive polymer is configured to transition from a first storage modulus to a second storage modulus when an external stimulus is applied to the electrically responsive polymer.

2. The electrically responsive polymer according to claim 1, wherein the base polymer matrix comprises epoxy, urethane, acrylate, olefin, styrene, polyester, polyether, polyamide, polyimide, or combinations thereof.

3. The electrically responsive polymer according to claim 2, wherein the base polymer chain has one or more functional groups on a main chain of the polymer or a side chain of the polymer.

4. The electrically responsive polymer according to claim 1, wherein the electrically responsive component comprises 3-amino-5-mercapto-1,2,4-triazole, 5-amino-1,3,4-thiadiazole-2-thiol5,5'-disulfanediyldi(1,3,4-thiadiazol-2-amine), 5,5'-disulfanediylbis(1H-1,2,4-triazol-3-amine), bis(2-hydroxyethyl)disulfide, bis(2-hydroxyphenyl)disulfide, bis(3-hydroxyphenyl)disulfide, bis(4-hydroxyphenyl)disulfide, bis(2-aminophenyl)disulfide, bis(3-aminophenyl)disulfide, or bis(4-aminophenyl)disulfide.

5. The electrically responsive polymer according to claim 1, wherein the electrolyte salt is an alkali salt.

6. The electrically responsive polymer according to claim 5, wherein the electrolyte salt is a lithium salt.

7. The electrically responsive polymer according to claim 6, wherein the lithium salt includes lithium perchlorate, lithium hexafluorophosphate, lithium hexafluorotitanate, lithium trifluoromethane sulfonate, or combinations thereof.

8. The electrically responsive polymer according to claim 1, wherein the external stimulus is an electrical voltage.

9. The electrically responsive polymer according to claim 1, wherein the electrically responsive polymer comprises one or more elastomeric polymers.

10. The electrically responsive polymer according to claim 1, wherein the electrically responsive polymer comprises one or more thermoset polymers.

11. A method of using the electrically responsive polymer in claim 1, the method comprising:
applying the external stimulus to the transducer;
allowing the storage modulus of the polymer to change; and
applying an alternate stimulus to the electrically responsive polymer that is either more positive or more negative than the external stimulus.

12. The method according to claim 11, wherein the external stimulus is an electrical voltage.

13. A damping device comprising:
at least two electrical contacts;
at least one electrically responsive polymer disposed between the electrical contacts, wherein:
the electrically responsive polymer comprises an electrically responsive bulk polymer matrix comprising a base polymer matrix, an electrically responsive component comprising a disulfide, an oligosulfide moiety, or plurality of thiol moieties and an electrolyte salt, and
the electrically responsive polymer is configured to transition from a first elastic modulus and a second elastic modulus when an external stimulus is applied to the electrically responsive polymer.

14. The damping device according to claim 13, wherein the contacts are electrodes.

15. The damping device according to claim 13, wherein the external stimulus is an electrical voltage.

16. The damping device according to claim 13, wherein the damping device further comprises:
a plurality of electrically responsive polymer cells, wherein each electrically responsive polymer cell, comprises at least one anode, at least one cathode, and at least one electrically responsive polymer disposed between the cathode and anode; and an insulating layer disposed between two or more electrically responsive polymer cells.

17. A method of using the device in claim 13, the method comprising:
adjusting a stiffness of the damping device to a level sufficient for damping a first vibrational frequency by applying a first electric voltage to increase or decrease the elastic modulus of the electrically responsive polymer from a first elastic modulus to a second elastic modulus, where the second elastic modulus corresponds to the stiffness sufficient for damping the first vibrational frequency; and
maintaining the device at substantially the second elastic modulus for a period of time, while removing the first electric voltage.

18. A method of using the device in claim 13, the method further comprising:
adjusting the stiffness to a level sufficient for damping a second vibrational frequency by applying a second electric voltage to increase or decrease the elastic modulus of the electrically responsive polymer from the second elastic modulus to a third elastic modulus, wherein the third elastic modulus corresponds to the stiffness sufficient for damping the second vibrational frequency; and
maintaining the device at substantially the third elastic modulus for a period of time, while removing the second electric voltage.

19. The method according to claim 17 or 18, wherein the period of time is greater than 40 minutes.

* * * * *